United States Patent
Robert

(10) Patent No.: US 8,431,445 B2
(45) Date of Patent: Apr. 30, 2013

(54) MULTI-COMPONENT POWER STRUCTURES AND METHODS FOR FORMING THE SAME

(75) Inventor: Brian Joseph Robert, Saint Clair Shores, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 13/150,645

(22) Filed: Jun. 1, 2011

(65) Prior Publication Data

US 2012/0306105 A1     Dec. 6, 2012

(51) Int. Cl.
*H01L 21/50* (2006.01)
*H01L 21/48* (2006.01)
*H01L 21/44* (2006.01)

(52) U.S. Cl.
USPC .......................................... 438/122; 438/121

(58) Field of Classification Search ................... 438/121, 438/122
See application file for complete search history.

(56) References Cited

U.S. PATENT DOCUMENTS

| | | | |
|---|---|---|---|
| 4,407,006 A | 9/1983 | Holick et al. | |
| 4,482,418 A | 11/1984 | Rigby | |
| 5,041,183 A | 8/1991 | Nakamura et al. | |
| 5,388,328 A | 2/1995 | Yokono et al. | |
| 5,542,602 A | 8/1996 | Gaynes et al. | |
| 5,574,630 A | 11/1996 | Kresge et al. | |
| 5,590,460 A | 1/1997 | DiStefano et al. | |
| 5,897,341 A | 4/1999 | Love et al. | |
| 6,002,177 A | 12/1999 | Gaynes et al. | |
| 6,066,808 A | 5/2000 | Kresge et al. | |
| 6,150,726 A | 11/2000 | Feilchenfeld et al. | |
| 6,187,678 B1 | 2/2001 | Gaynes et al. | |
| 6,236,115 B1 | 5/2001 | Gaynes et al. | |
| 6,465,879 B1 | 10/2002 | Taguchi | |
| 6,495,771 B2 | 12/2002 | Gaynes et al. | |
| 6,634,543 B2 | 10/2003 | Curcio et al. | |
| 6,809,412 B1 | 10/2004 | Tourino et al. | |
| 6,992,887 B2 * | 1/2006 | Jairazbhoy et al. | 361/689 |
| 6,998,713 B2 | 2/2006 | Narizuka et al. | |
| 7,023,089 B1 * | 4/2006 | Lu | 257/751 |
| 7,211,103 B2 | 5/2007 | Greenberg | |
| 7,357,293 B2 | 4/2008 | Suh | |
| 7,390,735 B2 * | 6/2008 | Mehrotra | 438/615 |
| 7,400,042 B2 | 7/2008 | Eriksen et al. | |
| 7,557,434 B2 | 7/2009 | Malhan et al. | |
| 7,628,309 B1 | 12/2009 | Eriksen et al. | |
| 7,659,614 B2 | 2/2010 | Mehrotra | |
| 7,727,806 B2 | 6/2010 | Uhland et al. | |
| 7,798,388 B2 | 9/2010 | Crockett et al. | |
| 7,830,021 B1 | 11/2010 | Wilcoxon et al. | |

(Continued)

*Primary Examiner* — Luan C Thai
(74) *Attorney, Agent, or Firm* — Dinsmore & Shohl LLP

(57) ABSTRACT

In one embodiment, a method for forming a multi-component power structure for use in electrically propelled vehicles may include constraining a parent material system between a power component and a thermal device. The parent material system may include a low temperature material having a relatively low melting point and a high temperature material having a relatively high melting point. The relatively low melting point may be less than the relatively high melting point. The parent material system can be heated to a melting temperature greater than the relatively low melting point and lower than the relatively high melting point to diffuse the low temperature material into the high temperature material. The parent material system can be solidified to form a transient liquid phase bond that is electrically and thermally conductive.

17 Claims, 7 Drawing Sheets

U.S. PATENT DOCUMENTS

| | | |
|---|---|---|
| 2007/0062021 A1 | 3/2007 | Crockett et al. |
| 2008/0156475 A1 | 7/2008 | Suh |
| 2009/0004500 A1 | 1/2009 | Suh et al. |
| 2009/0065142 A1 | 3/2009 | Zhang et al. |
| 2009/0142493 A1 | 6/2009 | Zhang et al. |
| 2009/0302394 A1 | 12/2009 | Fujita |
| 2010/0039779 A1 | 2/2010 | Mitchell et al. |
| 2010/0127046 A1 | 5/2010 | Mehrotra |
| 2011/0220704 A1* | 9/2011 | Liu et al. .................. 228/252 |
| 2012/0112201 A1* | 5/2012 | Otsuka et al. ............... 257/76 |

\* cited by examiner

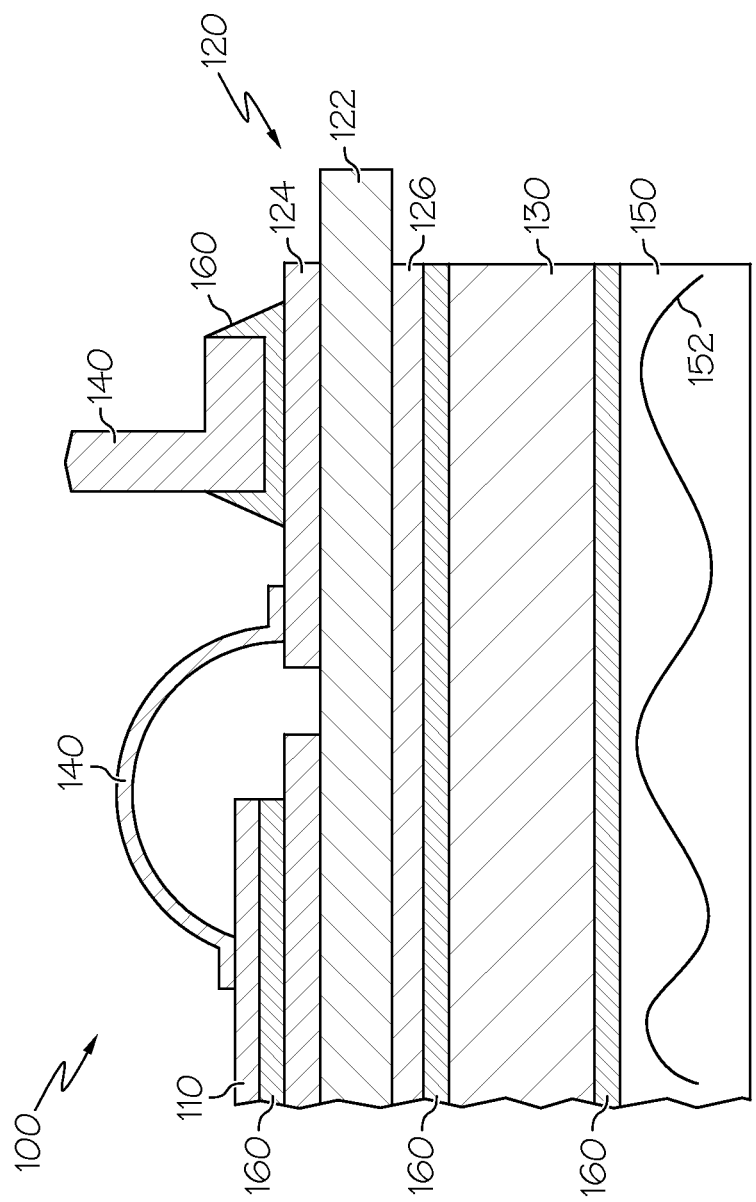

US 8,431,445 B2

MULTI-COMPONENT POWER STRUCTURES AND METHODS FOR FORMING THE SAME

TECHNICAL FIELD

The present specification generally relates to multi-component power structures for use in electrically propelled vehicles and methods for forming the same and, more specifically, to multi-component power structures bonded with transient liquid phase bonds and methods for forming the same.

BACKGROUND

As background, as the power density of power electronics modules and the operating temperatures of semiconductor devices increases, the number of suitable temperature tolerant bonding mechanisms and material selections decrease. As trends shift toward the need for lead-free attachment and higher melting temperature at the bond interface, electronic structures are moving away from conventional solder bonding techniques. Diffusion based attachment techniques are emerging as an alternative for bonding electronics structures.

Accordingly, a need exists for alternative multi-component power structures bonded with diffusion based attachment and methods for forming the same.

SUMMARY

In one embodiment, a method for forming a multi-component power structure for use in electrically propelled vehicles may include providing a semiconductor die, an insulating substrate having a first metal layer and a second metal layer and a thermal device having enclosed passages for liquid cooling. The semiconductor die and the first metal layer of the insulating substrate can be bonded with a first transient liquid phase bond that is electrically and thermally conductive. A parent material system can be constrained between the second metal layer of the insulating substrate and the thermal device. The parent material system may include a low temperature material having a relatively low melting point and a high temperature material having a relatively high melting point. The relatively low melting point may be less than the relatively high melting point. The parent material system can be heated to a melting temperature greater than the relatively low melting point and lower than the relatively high melting point to diffuse the low temperature material into the high temperature material. The parent material system can be solidified to form a second transient liquid phase bond that is electrically and thermally conductive.

In another embodiment, a method for forming a multi-component power structure for use in electrically propelled vehicles may include providing a parent material system comprising a low temperature material having a relatively low melting point and a high temperature material having a relatively high melting point. The multi-component power structure may have an operating temperature from about −40° C. to about 200° C. The relatively low melting point may be less than the relatively high melting point. A first surface of a first power component may be coated with a first layer of the high temperature material of the parent material system. A second surface of a thermal device may be coated with a second layer of the high temperature material of the parent material system. The first layer of the high temperature material of the parent material system and the second layer of the high temperature material of the parent material system may be formed by electroplating, electroless-plating, or sputter deposition prior to constraining the parent material system. The parent material system may be constrained between the thermal device and the first power component. The thermal device may include enclosed passages for liquid cooling. The parent material system can be heated to a melting temperature greater than the relatively low melting point and lower than the relatively high melting point to diffuse the low temperature material into the high temperature material. The parent material system can be solidified to form a first transient liquid phase bond that is electrically and thermally conductive. A second transient liquid phase bond can be formed to bond the first power component and a second power component. The second transient liquid phase bond can be electrically and thermally conductive. The first transient liquid phase bond and the second transient liquid phase bond can be formed sequentially such that one of the first transient liquid phase bond and the second transient liquid phase bond is heated as the other of the first transient liquid phase bond and the second transient liquid phase bond is formed.

In yet another embodiment, a multi-component power structure for use in electrically propelled vehicles may include an insulating substrate, a semiconductor die, a base plate and a thermal device. The insulating substrate may have a first metal layer and a second metal layer. The insulating substrate electrically may insulate the first metal layer from the second metal layer. The semiconductor die may be bonded to the first metal layer of the insulating substrate with a first transient liquid phase bond that is electrically and thermally conductive. The base plate may be bonded to the second metal layer of the insulating substrate with a second transient liquid phase bond that is electrically and thermally conductive. The thermal device may be bonded to the base plate with a third transient liquid phase bond that is electrically and thermally conductive. The thermal device may include enclosed passages with a thermal fluid disposed therein. The multi-component power structure may be operable at temperatures from about −40° C. to about 200° C. and can be an electrical inverter or a DC-to-DC converter.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 1 schematically depicts a multi-component power structure according to one or more embodiments shown and described herein;

DETAILED DESCRIPTION

Figure 3:
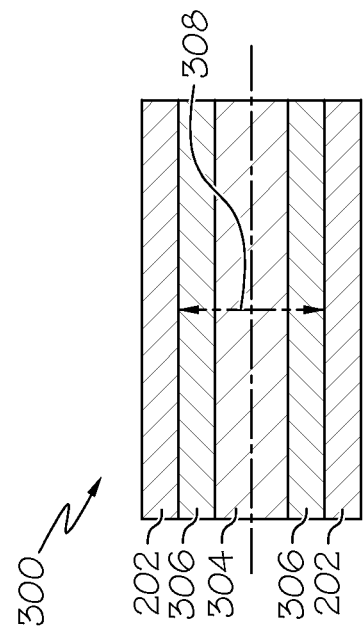
FIG. 3 schematically depicts a transient liquid phase bonding process according to one or more embodiments shown and described herein.
Figure 5:
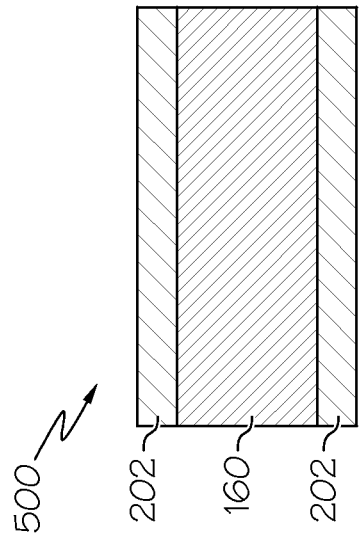
FIG. 5 schematically depicts a transient liquid phase bonding process according to one or more embodiments shown and described herein.

FIG. 1 generally depicts one embodiment of a multi-component power structure for use in electrically propelled vehicles. The multi-component power structure generally comprises a plurality of electrical components such as, for example, semiconductor devices, substrates, base plates, electrical interconnects, and thermal devices. The individual components of the multi-component power structure may be coupled together via an electrically and thermally conductive bond such as a diffusion bond or a transient liquid phase bond. Various embodiments of the multi-component power structure and methods for forming the same will be described in more detail herein.

Referring now to FIG. 1, a multi-component power structure 100 is schematically depicted. The multi-component power structure may be used in an electrically propelled vehicle such as, for example, a hybrid electric vehicle (HEV), a plug-in electric vehicle (PHEV), a battery electric vehicle (BEV) or an electric vehicle (EV). The multi-component power structure 100 may comprise a semiconductor die 110, an insulating substrate 120, a base plate 130, and a thermal device 150. The semiconductor die 110 may be a small block of semiconducting material upon which a functional circuit is fabricated. The functional circuit may be a multi-terminal power semiconductor device such as, for example, an insulated gate bipolar transistor (IGBT), a power diode, a thruster, a power metal oxide semiconductor field-effect transistor (MOSFET), or any other device suitable for handling similar power levels. The functional circuit may be fabricated according to any known semiconductor fabrication technique such as, for example, metal organic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD).

The semiconductor die 110 may be fabricated from any type of semiconducting material. Silicon is a well known semiconducting material, but other semiconducting materials such as compound materials may also be utilized. Specifically, elements from one or more different groups of the periodic table such as, for example, groups 13 through 16, can form binary, ternary, and quaternary semiconducting compounds. Such compounds may include boron, aluminum, gallium, indium, nitrogen, phosphorus, arsenic, antimony, bismuth, silicon and carbon.

The insulating substrate 120 may operate as an electrical insulator upon which electrical components of the multi-component power structure 100 are deposited or bonded. The insulating substrate 120 may comprise an insulating layer 122 disposed between a first metal layer 124 and a second metal layer 126. The insulating substrate may be a dielectric or an electrical insulator such as, for example, silicon oxide, aluminum oxide, aluminum nitride, silicon nitride, beryllium oxide or any other material that obstructs the flow of electric charge. The first metal layer 124 and the second metal layer 126 may comprise any electrically conductive metal such as copper or aluminum. The first metal layer 124 may be formed or etched to include distinct traces for forming electrical connections with electrical components or mounting points for forming mechanical couplings or thermally conductive connections with electrical components. Moreover, the second metal layer 126 may be formed or shaped to match the first metal layer 124. Specifically, the second metal layer 126 may have a substantially similar volume, a substantially similar cross-sectional area or a substantially similar outer perimeter as the first metal layer 124 in order to control the amount of thermal stress induced throughout the insulating substrate 120 during the operation of the multi-component power structure 100.

The base plate 130 may be shaped to increase the surface area for contact with a surrounding fluid (i.e., air). Specifically, the base plate 130 may comprise perforations, fins, and/or surface treatment (controlled surface roughness) in order to facilitate the transfer of thermal energy. Thus, heat may be transported by the base plate using conduction and/or convection. Moreover, the base plate may comprise a thermally conductive composite, ceramic or metal (e.g., copper or aluminum).

The thermal device 150 may operate as a heat transfer mechanism that can transport quantities of thermal energy with a thermal fluid having a different temperature than a device in thermal communication with the thermal device 150. The thermal device 150 may include an enclosed passage 152 for constraining the flow of a thermal fluid. The enclosed passage may comprise a thermally conductive material (e.g., a thermally conductive metal such as copper or aluminum). The thermal fluid may comprise any fluid capable of transferring thermal energy such as, for example, water, air, ethanol or mercury. Moreover, the enclosed passage 152 may be operatively coupled to a heat exchanger. For example, the thermal fluid may be circulated through a heat exchanger to communicate thermal energy from the thermal device to a fluid (e.g., air) surrounding the heat exchanger to heat or cool the thermal fluid. The thermal fluid may be circulated through the heat exchanger where thermal energy may be conducted to and/or from a surface of the heat exchanger and exchange thermal energy with the surrounding fluid. The rate of thermal energy exchange depends on the fluid properties, flow rate, conductance, and the surface area of the heat exchanger.

The multi-component power structure 100 may further comprise an electrical interconnect 140. The electrical interconnect 140 may operate to conduct electrical signals between the electrical components of the multi-component power structure 100 and/or electrical devices external to the multi-component power structure 100. The electrical interconnect 140 may be a ribbon, a wire, or a lead frame (i.e., a shaped conductive sheet for connecting multiple components simultaneously). The electrical interconnect 140 may comprise any electrically conductive material such as, for example, copper or aluminum.

Any of the electrical components described herein may be bonded together via an electrically and thermally conductive bond such as, for example, a solder bond or a transient liquid phase bond. Transient liquid phase (TLP) bonding is a diffusion bonding process used for joining various types of alloys and may be used for bonding metals, ceramics, and composites. TLP bonds may be stable for a range of temperatures and provide robust bonding for the thermal, electrical, and/or mechanical functions of a structure.

Figure 2:
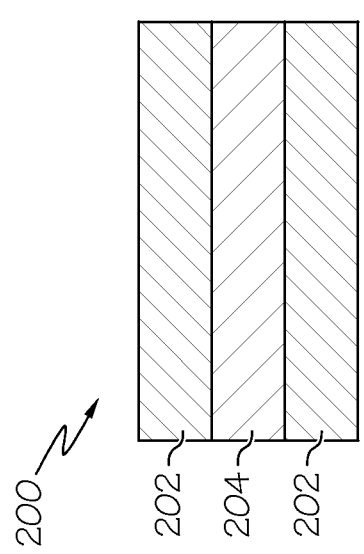
FIG. 2 schematically depicts a parent material system according to one or more embodiments shown and described herein.

Referring now to FIG. 2, TLP bonds may be formed from a parent material system 200 comprising alternating layers of high temperature material 202 and low temperature material 204 (i.e., interlayer materials). The high temperature material 202 has a relatively high melting point and the low temperature material 204 has a relatively low melting point (i.e., the relatively low melting point is less than the relatively high melting point). The parent material system 200 for TLP bonding may include diffusive materials (i.e., the high temperature material 202 and low temperature material 204 can be selected such that the low temperature material 204 is capable of diffusing into the high temperature material 202). The high temperature material 202 may include Au, Ag, Ni, Cu, alloys thereof and the like. The low temperature material 204 may include Sn, In, alloys thereof and the like. However, it is noted that, any group of materials may be selected such that the materials are diffusive into one another and have disparate melting points.

Figure 7:
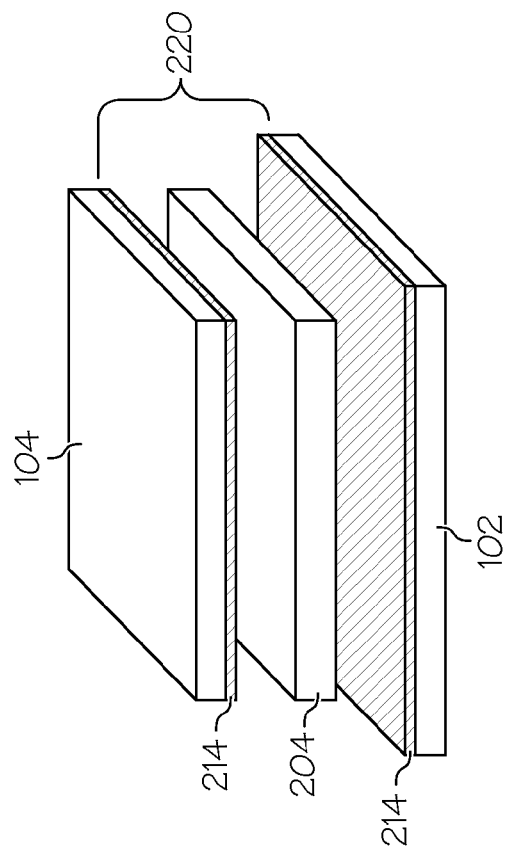
FIG. 7 schematically depicts a parent material system according to one or more embodiments shown and described herein.
Figure 8:
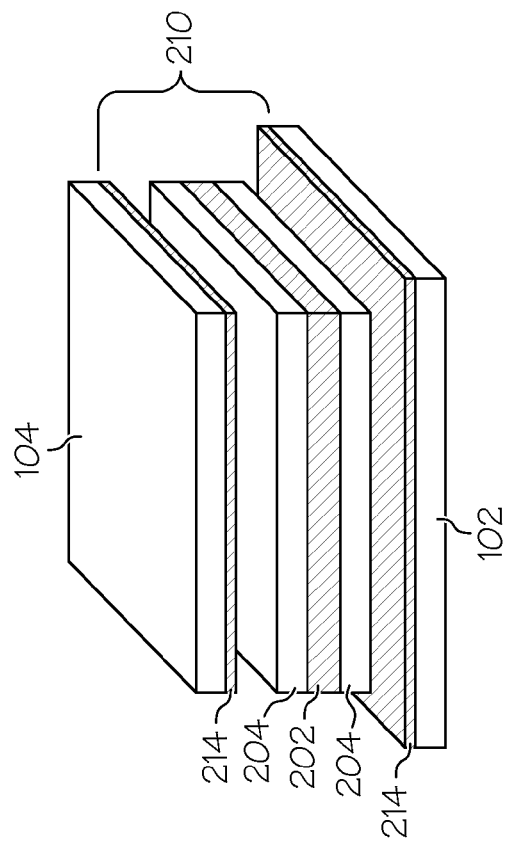
FIG. 8 schematically depicts a parent material system according to one or more embodiments shown and described herein.
Figure 10:
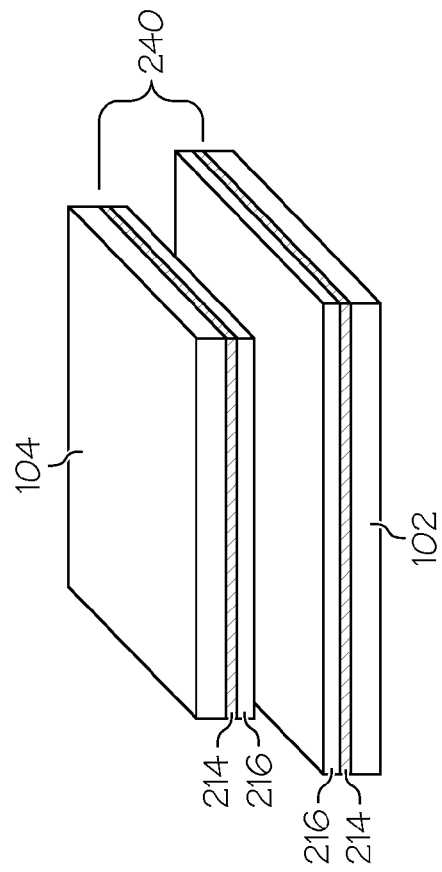
FIG. 10 schematically depicts a parent material system according to one or more embodiments shown and described herein.
Figure 9:
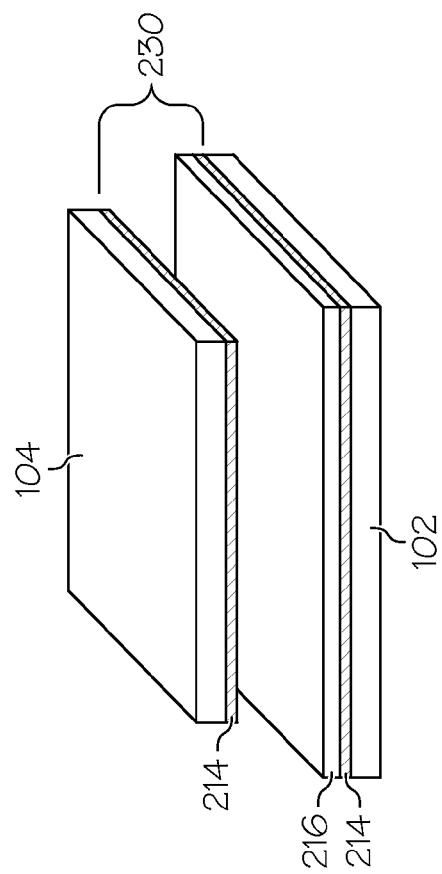
FIG. 9 schematically depicts a parent material system according to one or more embodiments shown and described herein.

Moreover, it is noted that, while FIG. 2 depicts a total of three interlayer materials, the parent material systems described herein may comprise any number of interlayer materials such that the low temperature material 204 may diffuse into the high temperature material 202 to form a diffusion bond. Specifically, the interlayer materials may be selected such that there is one more layer of high temperature material 202 than low temperature material 204 layers (as shown in FIGS. 7-9). Alternatively, the interlayer materials may be selected such that the material system includes an equal number of layers of high temperature material 202 and layers of low temperature material 204 (FIG. 10). In further embodiments, each interlayer may include multiple layers of different high temperature material 202 or low temperature material 204.

Referring collectively to FIGS. 2-6, a TLP bond 160 may be described according to a multi-phase theory. It is noted that the multi-phase theory is provided for clarity, and not intended to limit the embodiments described herein to any specific theory describing TLP bonding. The multi-phase theory may comprise the parent material system 200, the diffusion phase 300, the solidification phase 400, and the homogenization phase 500.

Figure 6:
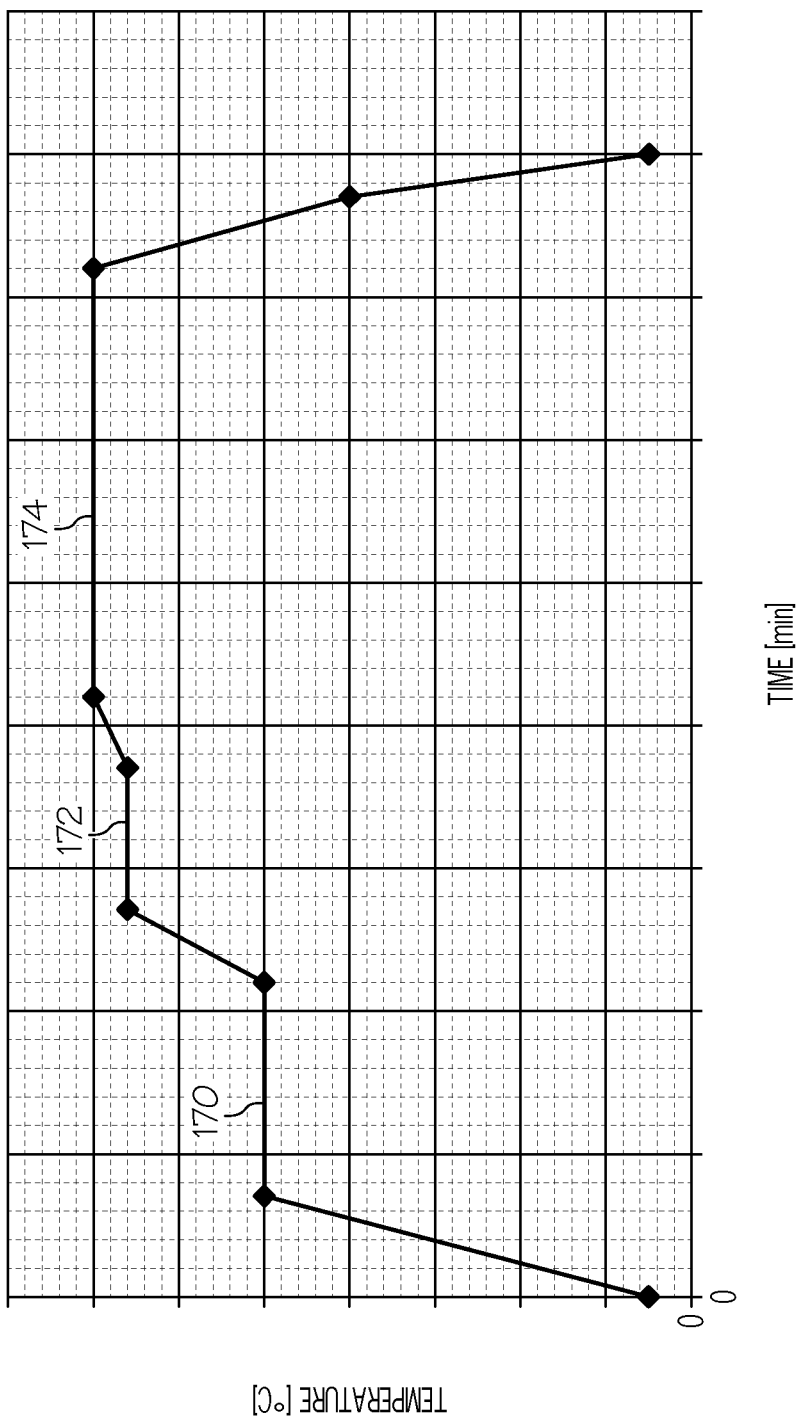
FIG. 6 graphically depicts processing temperatures (increasing along the axis of abscissa) versus time (increasing along the axis of ordinates) throughout a transient liquid phase bonding process according to one or more embodiments shown and described herein.

Referring to FIGS. 2 and 6, beginning with the parent material system 200, low temperature material 204 may be interposed between layers of high temperature material 202. The parent material system 200 may be compressed and gradually heated. As the temperature is increased beyond the melting point of the low temperature material 204 to a melting temperature 170, the low temperature material 204 may melt and homogenize.

Referring to FIGS. 2, 3 and 6, during the diffusion phase 300, the low temperature material 204 may be substantially completely dissolved into a liquefied low temperature material 304 and diffuse into the high temperature material 202. Specifically, the parent material system 200 may be subjected to the melting temperature 170 for a sufficient amount of time to allow the low temperature material 204 to melt and homogenize. The melting temperature 170 is dependent upon the parent material system 200, i.e., the melting temperature 170 may be any temperature high enough to melt the low temperature material 204. Accordingly, the melting temperature 170 may be greater than or equal to the relatively low melting point such as, for example, from about 225° C. to about 400° C. or about 230° C. to about 280° C.

Once the liquefied low temperature material 304 has been formed, the processing temperature can be gradually increased to a diffusion activation temperature 172 to initiate diffusion of the liquefied low temperature material 304 into the high temperature material 202. As the liquefied low temperature material 304 diffuses into the high temperature material 202 along the diffusion direction 308, diffusion regions 306 are formed in the high temperature material 202. The diffusion activation temperature 172 is dependent upon the parent material system 200, i.e., the diffusion activation temperature 172 may be based upon the diffusion activation energy, which depends upon the diffusion characteristics of the liquefied low temperature material 304 and the high temperature material 202. Accordingly, the diffusion activation temperature 172 may be any temperature high enough to initiate diffusion of the liquefied low temperature material 304 into the high temperature material 202. The diffusion activation temperature 172 is generally higher than the melting temperature 170 and lower than the maximum temperature 174 such as, for example, from about 230° C. to about 400° C., from about 230° C. to about 350° C., or from about 280° C. to about 350° C.

Figure 4:
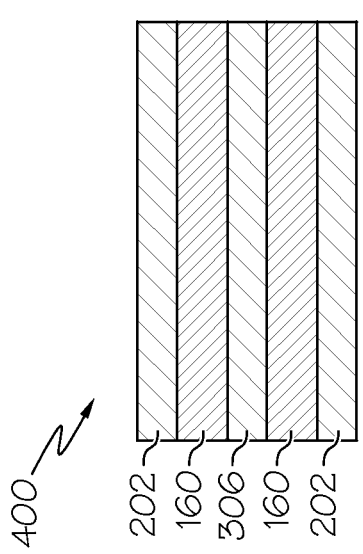
FIG. 4 schematically depicts a transient liquid phase bonding process according to one or more embodiments shown and described herein.

Referring to FIGS. 4 and 6, in the solidification phase 400, isothermal solidification occurs over time. As the process temperature is gradually increased to a maximum temperature 174, the diffusion regions 306 may begin to shrink as the diffusion regions 306 solidify from a liquefied low temperature material 304 interspersed within the solid high temperature material 202 into compound material (i.e., a TLP bond 160).

Referring to FIGS. 2, 4, 5 and 6, in the homogenization phase 500, the process temperature can be maintained at the maximum temperature 174 in order to reduce the diffusion time and anneal the materials. The maximum temperature 174 is dependent upon the parent material system 200, i.e., the maximum temperature 174 may be any temperature higher than the diffusion activation temperature 172 that reduces the amount of time for the completion of diffusion. The maximum temperature 174 is generally higher than the diffusion activation temperature 172 and is generally low enough such that the semiconductor die 110 (FIG. 1) is not heated above about 400° C. such as, for example, from about 325° C. to about 400° C. or about 350° C., or about 375° C., or about 400° C. Furthermore, it is noted that the melting temperature 170, the diffusion activation temperature 172, and the maximum temperature 174 are also dependent upon the amount of pressure applied to the parent material system 200. Accordingly, the temperatures described herein above may be modified when the compression is changed from about 35 psi (about 241 kPa).

By maintaining the maximum temperature 174, a TLP bond 160 can be homogenized as the diffusion regions 306 are substantially completely removed and replaced with a solidified compound material of the original parent material system 200. The solidified compound material thus may be a combination of the materials of the original parent material system 200, effectively altering the characteristics of the interlayer materials. The TLP bond may act as a mechanical coupling between components that is temperature tolerant (i.e., the melting point of the TLP bond 160 is higher than the relatively low melting point and lower than the relatively high melting point). Parent material systems 200 such as, for example, Ni—Sn, Ag—Sn, or Au—In may result in TLP bonds with a melting point that is substantially higher than the processing temperature, i.e., the melting point of the low temperature material 204 (e.g., Sn or In). It is noted that while a multi-phase theory having distinct material and temperature phases is described herein, suitable TLP bonds may be formed by a process which does not include such distinct phases or any other process that includes compression and the application of a temperature suitable to liquefy the low temperature material 204.

Various methods may be employed for the TLP bonding of electrical components (e.g. semiconductor devices, substrates, base plates, thermal devices, electrical interconnects, etc.) to an overall electronic structure or package. As will be described further herein, these methods may include, but are not limited to, the use of: a pre-treated metallization on bonding surfaces, a laminated metal alloy preform, a singular or multiple alloy paste, and/or a singular metal alloy preform.

Referring to FIGS. 7-10, methods for forming a multi-component power structure may include coating a surface of a first component 102 with a metallized layer of high temperature material 214 and/or coating a surface of a second component 104 with a metallized layer of high temperature material 214. The metallized layers of high temperature material 214 may be formed by a metal coating process that bonds the metallized layer to the coated component such as, for example, electroplating, electroless-plating, or sputter deposition. Other embodiments may be mechanically coupled to the metallized layer. In further embodiments, the electrical component may comprise or be integral with high temperature material 202.

Referring now to FIG. 7, the individual electrical components may be treated with the appropriate surface metallization size, thickness, and materials to enable TLP bonding upon intimate surface contact with the balance of the parent material system 210. For example, a material stack comprising low temperature material 204 may be compressed between the metallized layers of high temperature material 214. In one embodiment, the parent material system 210 may comprise a metallized layer of high temperature material 214 disposed on a first component 102, a metallized layer of high temperature material 214 disposed on a second component 104, two layers of low temperature material 204, and a layer of high temperature material 202. A TLP bond can be formed, as described hereinabove, by positioning the layer of high temperature material 202 between the two layers of low temperature material 204. The layers of high temperature material 202 and low temperature material 204 may then be positioned between the two metallized layers of high temperature material 214. Specifically, the layers of high temperature material 202 and low temperature material 204 may be formed into a layered preform prior to being positioned between the metallized layers of high temperature material 214. The layered preform may be a unified stack of distinct layers of materials pre-shaped to promote TLP bonding (i.e., cross-sectional shape to match the desired bond region of an electrical component). The layered preform may be formed by any process suitable to provide distinct layers such as, for example, metallization. In another embodiment, a foil comprising the high temperature material 202 and/or low temperature material 204 may be utilized.

In further embodiments, the layers of high temperature material 202 and low temperature material 204 may be formed from multiple layers of paste. Specifically, the individual layers of paste may be coated upon one of the metallized layers of high temperature material 214 one layer at a time. The paste may comprise a suspension of metal powder and may be substantially viscous at room temperature. When heated, according to the embodiments described herein, the paste may form a TLP bond. The paste may further include flux that mitigates oxidation of the high temperature material 202 and/or the low temperature material 204.

Referring to FIG. 8, the TLP bonding of the present disclosure may include positioning a single alloy preform between appropriate surface metallization layers. In one embodiment, the parent material system 220 may comprise a metallized layer of high temperature material 214 disposed on a first component 102, a metallized layer of high temperature material 214 disposed on a second component 104, and a layer of low temperature material 204 positioned between the metallized layers of high temperature material 214. A TLP bond can be formed, as described hereinabove, by positioning the layer of low temperature material 204 between the metallized layers of high temperature material 214. In another embodiment, a paste comprising the low temperature material 204 may be positioned between the metallized layers of high temperature material 214. In further embodiments, a foil and/or a preform comprising the low temperature material 204 may be positioned between the metallized layers of high temperature material 214. Upon forming the parent material system 220, the parent material system 220 may be compressed and gradually heated to form a TLP bond between the first component 102 and the second component 104.

Referring now to FIG. 9, TLP bonds may be formed by a parent material system 230 comprising metallized layers. The parent material system 230 may include a metallized layer of high temperature material 214 disposed on a first component 102, a metallized layer of high temperature material 214 disposed on a second component 104, and a metallized layer of low temperature material 216. As is noted above, the metallized layers may be formed according to any known metal coating process such as, for example, electroplating, electroless-plating, or sputter deposition. Thus, each of the first component 102 and the second component may be coated with a metallized layer of high temperature material 214. Then the metallized layer of high temperature material 214 of the first component 102 may be coated with the metallized layer of low temperature material 216. After the parent material system 230 is formed, a TLP bond between the first component 102 and the second component 104 may be formed as described herein.

In a further embodiment, depicted in FIG. 10, the parent material system 240 may include a metallized layer of high temperature material 214 disposed on a first component 102, a metallized layer of high temperature material 214 disposed on a second component 104, and two metallized layers of low temperature material 216. Specifically, each of the first component 102 and the second component 104 may be coated with a metallized layer of high temperature material 214. Then each of the metallized layers of high temperature material 214 may be coated with a metallized layer of low temperature material 216. Once the parent material system 240 is formed from the metallized layers, a TLP bond between the first component 102 and the second component 104 may be formed as described herein.

It is noted that, while FIG. 10 depicts a single metallized layer of high temperature material 214 and a single metallized layer of low temperature material 216 disposed on each of the components, the embodiments described herein may be metallized with any number of alternating metallized layers of high temperature material 214 and metallized layers of low temperature material 216 (i.e., interlayer materials) such that metallized layer in contact with the component is a metallized layer of high temperature material 214. When the bonding process is complete, the TLP bond may create a solid alloy comprising the parent material system 240 having a composite melting point that is greater than the relatively low melting point and less than the relatively high melting point.

Figure 11:
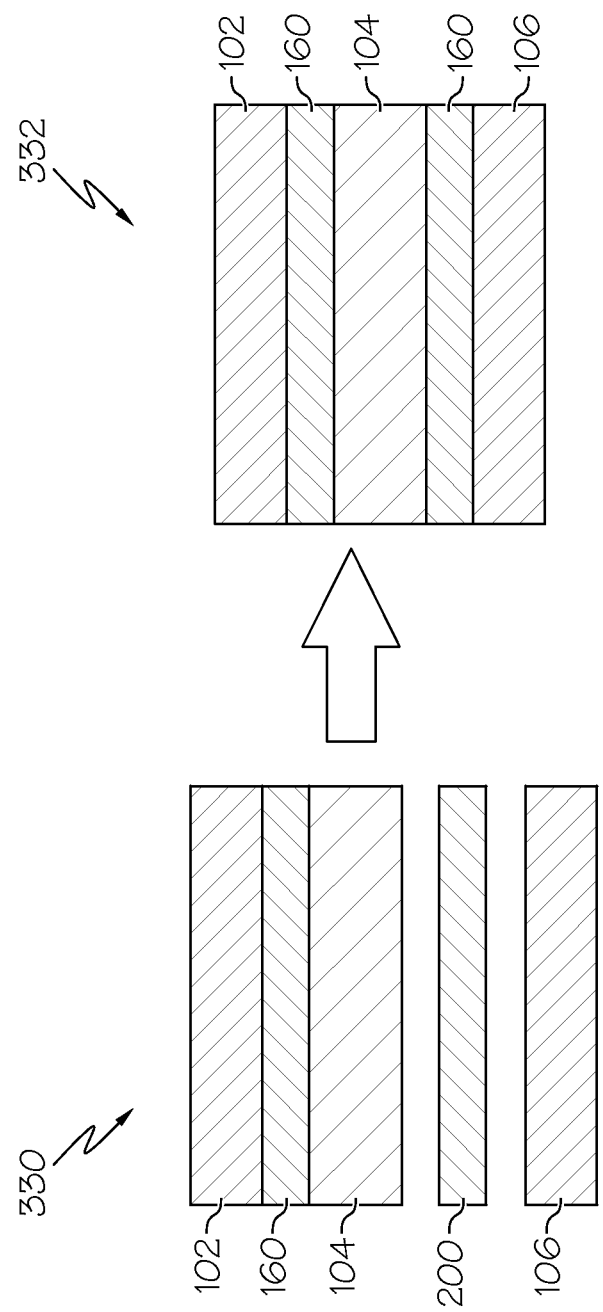
FIG. 11 schematically depicts a transient liquid phase bonding process according to one or more embodiments shown and described herein.

In one embodiment, depicted in FIGS. 2 and 11, a method for forming a multi-component power structure may include forming a single bonded structure 330 prior to forming a multi-bonded structure 332. The single bonded structure 330 may comprise a first component 102 and a second component 104 with a TLP bond 160 disposed between the first component 102 and the second component 104. The TLP bond 160 may couple the first component 102 and the second component 104 electrically, thermally and mechanically to form the single bonded structure 330. Since the TLP bond 160 has a composite melting point that is greater than the relatively low melting point, the single bonded structure 330 may be heated to a temperature above the relatively low melting point to form a TLP bond 160 between the second component 104 and the third component 106 without melting the TLP bond 160 disposed between the first component 102 and the second component 104.

For example, the single bonded structure 330 may be TLP bonded to a third component 106 by positioning a parent material system 200 between the second component 104 of the single bonded structure 330 and the third component 106. Once positioned, the parent material system 200 may be processed into a TLP bond 160 (i.e., compressed and heated). The processing may be repeated to form a multi-component structure including any number of electrical components bonded via any number of TLP bonds. For example, multi-component structures having three or more TLP bonds may be created.

Referring back to FIG. 1, a multi-component power structure 100 may be formed by creating multiple TLP bonds 160 sequentially (i.e., multiple iterations of the multi-phase theory) or simultaneously (i.e., a single iteration of the multi-phase theory). The multi-component power structure 100 may comprise a semiconductor die 110, an insulating substrate 120, a base plate 130, an electrical interconnect 140 and a thermal device 150. The semiconductor die 110 and a first metal layer 124 of the insulating substrate 120 may be electrically and thermally coupled via a TLP bond 160. The base plate 130 and a second metal layer 126 of the insulating substrate 120 may be electrically and thermally coupled via a TLP bond 160. The electrical interconnect 140 and a first metal layer 124 of the insulating substrate 120 may be electrically and thermally coupled via a TLP bond 160. The thermal device 150 and the base plate 130 may be electrically and thermally coupled via a TLP bond 160.

Figure 12:
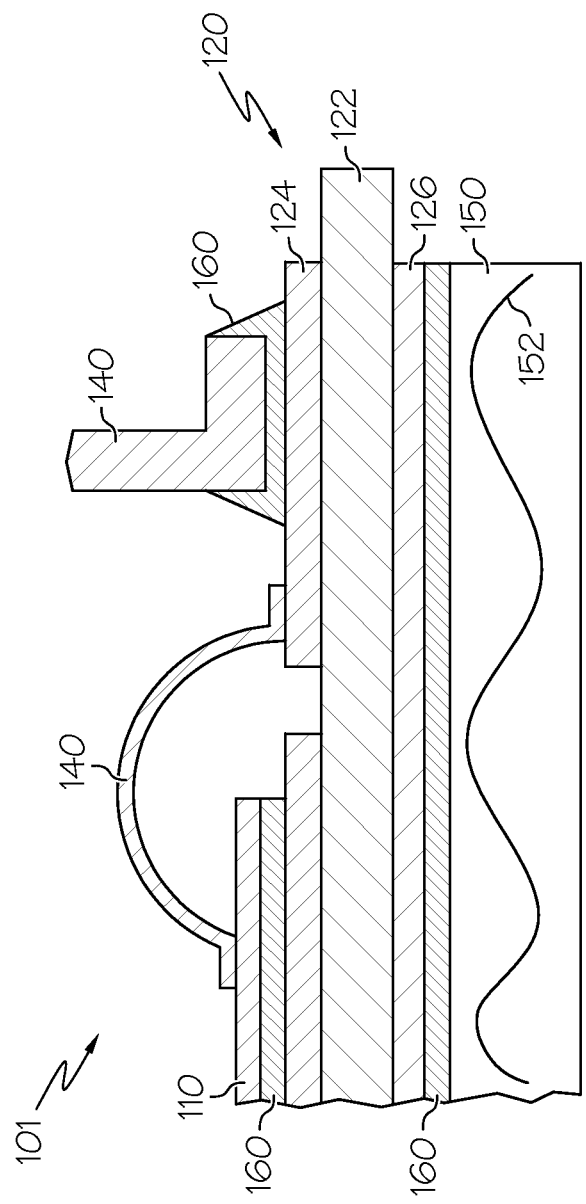
FIG. 12 schematically depicts a multi-component power structure according to one or more embodiments shown and described herein.

In another embodiment, depicted in FIG. 12, a multi-component power structure 101 may be formed without the base plate 130 (FIG. 1), i.e., the thermal device 150 and the insulating substrate 120 may be bonded to one another. For example, the multi-component power structure 101 may comprise a semiconductor die 110, an insulating substrate 120, an electrical interconnect 140 and a thermal device 150. The semiconductor die 110 and a first metal layer 124 of the insulating substrate 120 may be electrically and thermally coupled via a TLP bond 160. The thermal device 150 and a second metal layer 126 of the insulating substrate 120 may be electrically and thermally coupled via a TLP bond 160. The electrical interconnect 140 and a first metal layer 124 of the insulating substrate 120 may be electrically and thermally coupled via a TLP bond 160.

It should be understood that electronics packages having multiple electrical components (e.g., electrical interconnect, semiconductor device, insulated metal substrate, base plate, thermal device, etc.) may be formed according to the embodiments described herein. For example, power modules such as an electrical inverter or a DC-to-DC converter (e.g., buck and/or boost converter) that are operable at a temperature from about −40° C. to about 200° C. may be formed. Such power modules may be suitable for use in an electrically propelled vehicle for communicating electrical energy between batteries, generators, and/or motors via, for example, an electrical interconnect. Since the power module may be configured for continuous operation at temperatures ranging from about −40° C. to about 200° C. and may include various different materials such as, for example, aluminum, copper, silicon and silicon-carbide, the power module may be subjected to a broad range of thermal stresses. In order to accommodate the thermally induced stresses caused by the use of various different materials at such a temperature range, each of the components of the power module may be bonded to each other through the use of TLP bonds. Therefore, a power module formed according to the embodiments described herein may be capable of operation in a electrically propelled vehicle in temperatures ranging from a cold winter day to a hot summer day.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for forming a multi-component power structure, the method comprising:
   providing a semiconductor die, an insulating substrate having a first metal layer and a second metal layer, a thermal device having enclosed passages for liquid cooling, and a parent material system, wherein the parent material system comprises a low temperature material having a relatively low melting point and a high temperature material having a relatively high melting point, and the relatively low melting point is less than the relatively high melting point;
   bonding the semiconductor die and the first metal layer of the insulating substrate with a first transient liquid phase bond that is electrically and thermally conductive;
   coating the second metal layer of the insulating substrate with a first layer of the high temperature material of the parent material system;
   coating a surface of the thermal device with a second layer of the high temperature material of the parent material system;
   constraining the parent material system between the second metal layer of the insulating substrate and the thermal device;

heating the parent material system to a melting temperature greater than the relatively low melting point and lower than the relatively high melting point to diffuse the low temperature material into the high temperature material; and solidifying the parent material system to form a second transient liquid phase bond that is electrically and thermally conductive.

2. The method of claim 1, wherein the first layer of the high temperature material of the parent material system and the second layer of the high temperature material of the parent material system are formed by electroplating, electroless-plating, or sputter deposition.

3. The method of claim 1, further comprising positioning a layered preform between the first layer of the high temperature material of the parent material system and the second layer of the high temperature material of the parent material system, wherein the layered preform comprises a third layer of the high temperature material disposed between a first layer of the low temperature material and a second layer of the low temperature material.

4. The method of claim 1, further comprising positioning a single alloy preform between the first layer of the high temperature material of the parent material system and the second layer of the high temperature material of the parent material system, wherein the single alloy preform comprises the low temperature material.

5. The method of claim 1, further comprising positioning a paste between the first layer of the high temperature material of the parent material system and the second layer of the high temperature material of the parent material system, wherein the paste comprises the low temperature material.

6. The method of claim 5, wherein the paste further comprises a high temperature material.

7. The method of claim 1, further comprising coating the first layer of the high temperature material of the parent material system and/or the second layer of the high temperature material of the parent material system with a layer of the low temperature material of the parent material system.

8. The method of claim 1, wherein the thermal device is formed from aluminum.

9. The method of claim 1, wherein the multi-component power structure is operable at an operating temperature from about −40° C. to about 200° C.

10. The method of claim 1, wherein the high temperature material comprises Au, Ag, Ni, or Cu and the low temperature material comprises Sn or In.

11. The method of claim 1, wherein the second transient liquid phase bond has a melting point greater than the relatively low melting point.

12. A method for forming a multi-component power structure wherein the multi-component power structure has an operating temperature from about −40° C. to about 200° C., the method comprising:
providing a parent material system comprising a low temperature material having a relatively low melting point and a high temperature material having a relatively high melting point, wherein the relatively low melting point is less than the relatively high melting point;
coating a first surface of a first power component with a first layer of the high temperature material of the parent material system;
coating a second surface of a thermal device with a second layer of the high temperature material of the parent material system, wherein the first layer of the high temperature material of the parent material system and the second layer of the high temperature material of the parent material system are formed by electroplating, electroless-plating, or sputter deposition prior to constraining the parent material system;
constraining the parent material system between the thermal device and the first power component, wherein the thermal device comprises enclosed passages for liquid cooling;
heating the parent material system to a melting temperature greater than the relatively low melting point and lower than the relatively high melting point to diffuse the low temperature material into the high temperature material;
solidifying the parent material system to form a first transient liquid phase bond that is electrically and thermally conductive; and
forming a second transient liquid phase bond to bond the first power component and a second power component, wherein the second transient liquid phase bond is electrically and thermally conductive and the first transient liquid phase bond and the second transient liquid phase bond are formed sequentially such that one of the first transient liquid phase bond and the second transient liquid phase bond is heated as the other of the first transient liquid phase bond and the second transient liquid phase bond is formed.

13. The method of claim 12, further comprising positioning a layered preform between the first layer of the high temperature material of the parent material system and the second layer of the high temperature material of the parent material system, wherein the layered preform comprises a third layer of the high temperature material disposed between a first layer of the low temperature material and a second layer of the low temperature material.

14. The method of claim 12, further comprising positioning a single alloy preform between the first layer of the high temperature material of the parent material system and the second layer of the high temperature material of the parent material system, wherein the single alloy preform comprises the low temperature material.

15. The method of claim 12, further comprising positioning a paste between the first layer of the high temperature material of the parent material system and the second layer of the high temperature material of the parent material system, wherein the paste comprises the low temperature material.

16. The method of claim 12, further comprising coating the first layer of the high temperature material of the parent material system and/or the second layer of the high temperature material of the parent material system with a layer of the low temperature material of the parent material system.

17. The method of claim 12, wherein the first power component is an electrical interconnect, a semiconductor device, an insulating substrate, or a base plate.

* * * * *